(12) United States Patent
Murakoshi

(10) Patent No.: US 7,550,838 B2
(45) Date of Patent: Jun. 23, 2009

(54) SEMICONDUCTOR DEVICE

(75) Inventor: Tamotsu Murakoshi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 11/510,748

(22) Filed: Aug. 28, 2006

(65) Prior Publication Data

US 2006/0289897 A1 Dec. 28, 2006

Related U.S. Application Data

(63) Continuation of application No. PCT/JP2005/017779, filed on Sep. 27, 2005.

(30) Foreign Application Priority Data

Sep. 28, 2004 (JP) ............................. 2004-282759

(51) Int. Cl.
*H01L 23/48* (2006.01)
(52) U.S. Cl. .................. 257/693; 257/E21.59
(58) Field of Classification Search .................. 257/772, 257/784, 786, 665, 503, 737, 363
See application file for complete search history.

(56) References Cited

U.S. PATENT DOCUMENTS

| 5,319,224 | A | | 6/1994 | Sakashita et al. | |
|---|---|---|---|---|---|
| 5,699,289 | A | * | 12/1997 | Takenaka | 365/51 |
| 5,789,808 | A | * | 8/1998 | Yamasaki et al. | 257/693 |
| 6,617,622 | B2 | * | 9/2003 | Kudou et al. | 257/207 |
| 6,753,481 | B2 | * | 6/2004 | Novak | 174/255 |
| 2004/0159892 | A1 | * | 8/2004 | Takizawa | 257/363 |
| 2005/0056932 | A1 | * | 3/2005 | Shinjo | 257/737 |

FOREIGN PATENT DOCUMENTS

| JP | 60-070742 A | 4/1985 |
|---|---|---|
| JP | 63-310134 A | 12/1988 |
| JP | 03-125430 A | 5/1991 |
| JP | 9-237800 | 9/1997 |
| JP | 2001-223337 A | 8/2001 |
| JP | 2002-270779 A | 9/2002 |
| JP | 2003-163267 A | 6/2003 |
| JP | 2004-193601 A | 7/2004 |

* cited by examiner

*Primary Examiner*—Wai-Sing Louie
*Assistant Examiner*—Bilkis Jahan
(74) *Attorney, Agent, or Firm*—Oblon, Spivak, McClelland, Maier & Neustadt, P.C.

(57) ABSTRACT

A semiconductor device includes a first power supply which is disposed in a first direction, a first pad array which is disposed in the first direction, adjacent to the first power supply line, a second power supply line extending in the first direction, a first buffer circuit which is disposed between pads included in the first pad array, a second pad array which is disposed in the first direction, a third power supply line extending along the second pad array such that the second pad array is interposed between the second power supply line and the third power supply line, and a second buffer circuit which is disposed between pads included in the second pad array, and which is operated by a voltage between the second and third power supply lines.

4 Claims, 11 Drawing Sheets

SEMICONDUCTOR DEVICE

CROSS-REFERENCE TO RELATED APPLICATIONS

This is a Continuation Application of PCT Application No. PCT/JP2005/017779, filed Sep. 27, 2005, which was published under PCT Article 21(2) in Japanese.

This application is based upon and claims the benefit of priority from prior Japanese Patent Application No. 2004-282759, filed Sep. 28, 2004, the entire contents of which are incorporated herein by reference.

BACKGROUND OF THE INVENTION

1. Field of the Invention

The present invention relates to a semiconductor device, and relates, for example, to layouts of pads, power supply lines and buffer circuits in a semiconductor chip.

2. Description of the Related Art

Normally, a semiconductor chip is provided with pads for input/output of signals. In a conventionally widely adopted pad layout, pad arrays are disposed along mutually opposed two sides (or four sides) of the semiconductor chip. However, for example, in a case where a memory cell array and a peripheral circuit thereof are formed on a semiconductor chip, the length of signal wiring lines for connecting a pad array, which is disposed adjacent to the memory cell array, and the peripheral circuit increases. As a result, a problem arises that the wiring resistance and wiring capacitance increase and a signal delay occurs.

Buffer circuits, such as input buffers and output buffers, are provided adjacent to the respective pad arrays. Power supply lines for supplying power to the buffer circuits are needed, leading to an increase in pattern occupation area. In particular, with recent increases in integration density and enhancement in function of semiconductor devices, there is a tendency that the area of an external connection region (pad arrays, power supply lines and buffer circuits), which occupies the surface of the semiconductor chip, increases.

In order to cope with an increase in number of pads, Patent Document 1, for instance, discloses an example of a pad layout and a lead layout, which is adaptive to reduction in size of the semiconductor chip and an increase in number of pins and a decrease in pitch of a package. However, no consideration is given to the length of signal wiring lines and the layout of power supply lines and buffer circuits. The prior art is not satisfactory from the standpoint of suppression of signal delay and reduction in pattern occupation area of the external connection region.

Patent Document 1: Jpn. Pat. Appln. KOKAI Publication No. 9-237800

BRIEF SUMMARY OF THE INVENTION

The present invention provides a semiconductor device which can decrease the length of signal wiring to reduce signal delay, and can decrease the pattern occupation area of an external connection region.

According to an aspect of the present invention, there is provided a semiconductor device comprising: a first power supply line extending in one direction along one side of a semiconductor chip; a first pad array which is disposed in the first direction, adjacent to the first power supply line; a second power supply line extending in the first direction along the first pad array such that the first pad array is interposed between the first power supply line and the second power supply line; a first buffer circuit which is disposed between pads included in the first pad array, and which is operated by a voltage between the first and second power supply lines; a second pad array which is disposed in the first direction, adjacent to the second power supply line; a third power supply line extending along the second pad array such that the second pad array is interposed between the second power supply line and the third power supply line; and a second buffer circuit which is disposed between pads included in the second pad array, and which is operated by a voltage between the second and third power supply lines.

According to another aspect of the present invention, there is provided a semiconductor device comprising: a first power supply line extending in one direction along one side of a semiconductor chip; a first pad array which is disposed in the first direction, adjacent to the first power supply line; a second power supply line extending in the first direction along the first pad array such that the first pad array is interposed between the first power supply line and the second power supply line; first buffer circuits which are disposed between a pad included in the first pad array and the first power supply line and between the pad included in the first pad array and the second power supply line, and which are operated by a voltage between the first and second power supply lines; a second pad array which is disposed in the first direction, adjacent to the second power supply line; a third power supply line extending along the second pad array such that the second pad array is interposed between the second power supply line and the third power supply line; and second buffer circuits which are disposed between a pad included in the second pad array and the second power supply line and between the pad included in the second pad array and the third power supply line, and which are operated by a voltage between the second and third power supply lines.

DETAILED DESCRIPTION OF THE INVENTION

Figure 1:
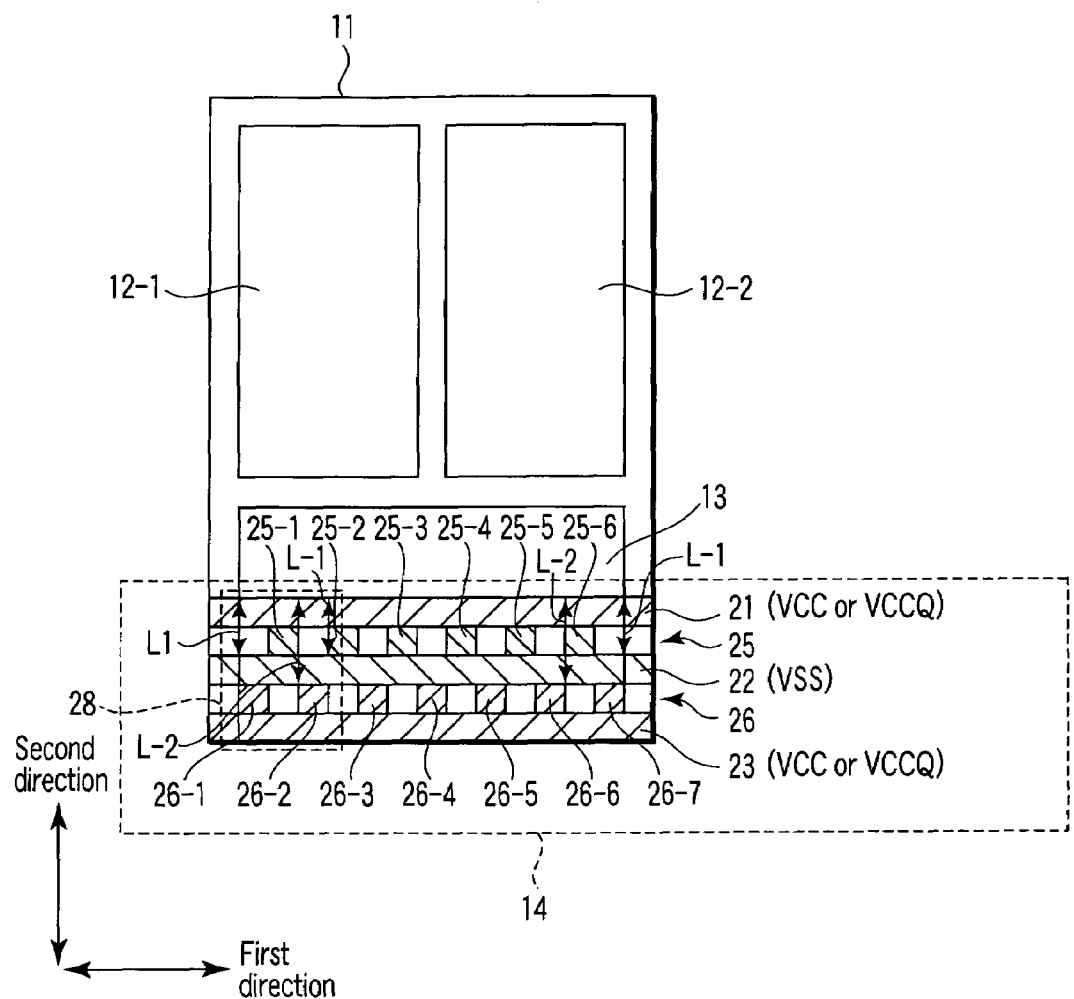
FIG. 1 is a view for describing a semiconductor device according to a first embodiment of the present invention, FIG. 1 being a plan view that schematically shows a layout of a semiconductor memory chip.

Embodiments of the present invention will now be described with reference to the accompanying drawings. In the description below, common parts are designated by like reference numerals throughout the drawings.

First Embodiment

To begin with, a semiconductor device according to a first embodiment of the invention is described with reference to FIG. 1 and FIG. 2. FIG. 1 is a plan view that schematically shows the layout of a semiconductor memory chip.

As shown in the Figures, a semiconductor chip 11 includes cell arrays 12-1 and 12-2, a peripheral circuit 13 and an external connection region 14.

The external connection region 14 is disposed in the vicinity of the peripheral circuit 13 along one side of the chip 11. In the external connection region 14, there are arranged first to third power supply lines 23, 22, 21 which extend in a first direction along one side of the chip 11, first and second pad arrays 26 and 25, and first and second buffer circuits. A power supply voltage VCC (or power supply voltage VCCQ) is applied to the power supply lines 23 and 21, and a power supply voltage VSS is applied to the power supply line 22. The pad array 26 is disposed between the power supply lines 23 and 22, and the pad array 25 is disposed between the power supply lines 22 and 21. The pad array 26 comprises a plurality of pads 26-1 to 26-7 (seven pads in this example). Buffer circuits are provided in non-occupied regions between the pads 26-1 to 26-7, or in regions between the pads 26-1 to 26-7 and the power supply lines 23 and 22. The pad array 26 is used for input, output or input/output of data.

The pad array 25 comprises a plurality of pads 25-1 to 25-6 (six pads in this example). Buffer circuits are provided in non-occupied regions between the pads 25-1 to 25-6, or in regions between the pads 25-1 to 25-6 and the power supply lines 22 and 21. The pad array 25 is used for input, output or input/output of control signals. The pads 25-1 to 25-6 of the pad array 25 are arranged in the first direction with a displacement of about ½ pitch, relative to the pads 26-1 to 26-7 of the pad array 26. Thus, the pads 26-1 to 26-7 and the pads 25-1 to 25-6 of the pad arrays 26 and 25 are arranged in a staggered fashion.

Figure 2:
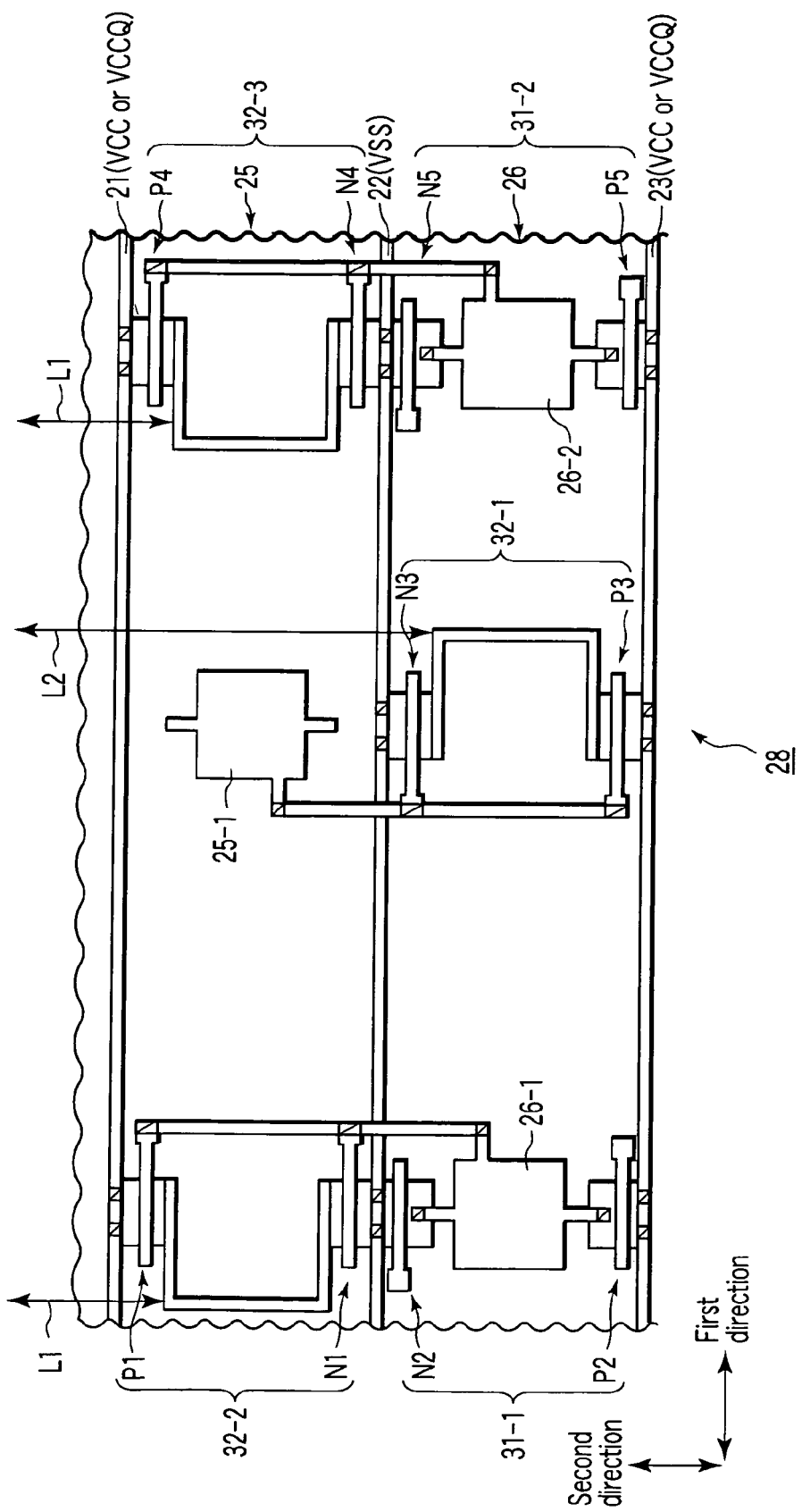
FIG. 2 is a plan view that shows, in enlarged scale, a part boxed by a broken line in FIG. 1.

FIG. 2 is a view for describing in detail an example of the pattern layout of the external connection region 14 (pads, power supply lines and buffer circuits). FIG. 2 is a plan view showing, in enlarged scale, a part boxed by a broken line 28 in FIG. 1.

As shown in FIG. 2, buffer circuits are provided in non-occupied regions between the pads of the pad arrays 26 and 25 and in regions between the pads and the power supply lines. In this example, input buffers and output buffers are connected to the associated pads.

An input buffer 32-1 is disposed between the pads 26-1 and 26-2, and is operated by a voltage between the power supply lines 23 and 22. The input buffer 32-1 is composed of an NMOS transistor N3 and a PMOS transistor P3. These transistors N3 and P3 have gates connected to the pad 25-1 and drains connected to the peripheral circuit 13. A signal that is input to the pad 25-1 is supplied to the peripheral circuit 13 via the input buffer 32-1.

The pad 25-1 is used, for example, for input of a control signal. The input control signal is supplied to the peripheral circuit 13 via the input buffer 32-1.

An output buffer 31-1 is composed of a PMOS transistor P2, which is disposed between the pad 26-1 and the power supply line 23, and an NMOS transistor N2 which is disposed between the pad 26-1 and the power supply line 22. The transistors P2 and N2 are disposed to be opposed to each other so as to sandwich the pad 25-1 in a second direction (crossing the first direction). The transistors P2 and N2 have gates connected to the peripheral circuit 13 and drains commonly connected to the pad 25-1.

An input buffer 32-2 is disposed on a non-occupied region on the left side of the pad 25-1, and is operated by a voltage between the power supply lines 21 and 22. The input buffer 32-2 is composed of an NMOS transistor N1 and a PMOS transistor P1. These transistors N1 and P1 have gates connected to the pad 26-1 and drains commonly connected to the peripheral circuit 13. A signal that is input to the pad 26-1 is supplied to the peripheral circuit 13 via the input buffer 32-2.

An output buffer 31-2 is composed of a PMOS transistor P2, which is disposed between the pad 26-1 and the power supply line 23, and an NMOS transistor N2 which is disposed between the pad 26-1 and the power supply line 22. The transistors P2 and N2 are disposed to be opposed to each other so as to sandwich the pad 26-1 in the second direction. The transistors P2 and N2 have gates connected to the peripheral circuit 13 and drains commonly connected to the pad 26-1.

The pad 26-1 is used, for example, for input/output of data. The input data is supplied to the peripheral circuit 13 via the input buffer 32-2. Data, which is transferred from the peripheral circuit 13, is output from the pad 26-1 via the output buffer 31-2.

Similarly, an input buffer 32-3 is disposed on a non-occupied region on the right side of the pad 25-1, and is operated by a voltage between the power supply lines 21 and 22. The input buffer 32-3 is composed of an NMOS transistor N4 and a PMOS transistor P4. These transistors N4 and P4 have gates connected to the pad 26-2 and drains commonly connected to the peripheral circuit 13. A signal that is input to the pad 26-2 is supplied to the peripheral circuit 13 via the input buffer 32-3.

An output buffer 31-2 is composed of a PMOS transistor P5, which is disposed between the pad 26-2 and the power supply line 23, and an NMOS transistor N5 which is disposed between the pad 26-2 and the power supply line 22. The transistors P5 and N5 are disposed to be opposed to each other so as to sandwich the pad 26-2 in the second direction. The transistors P5 and N5 have gates connected to the peripheral circuit 13 and drains commonly connected to the pad 26-2.

The pad 26-2 is used, for example, for input/output of data. The input data is supplied to the peripheral circuit 13 via the input buffer 32-3. Data, which is transferred from the peripheral circuit 13, is output from the pad 26-2 via the output buffer 31-3.

It is possible that the gates of the transistors N2, N4, N6, P2, P4 and P6 may be individually supplied with voltages and be independently controlled.

As has been described above, in the semiconductor device according to the present embodiment, the pad arrays 26 and 25 are provided in two rows in the same direction in the vicinity of the peripheral circuit 13. Thus, wiring lengths L1 and L2 between the pads of the pad arrays 26 and 25 and the peripheral circuit 13 can be reduced. Therefore, the wiring resistance and wiring capacitance can be reduced, and the signal delay can be decreased. This is advantageous for high-speed operations. In particular, in many cases, signals with relatively unstable voltages are used in a first-stage input circuit. Therefore, the instability in potential due to an increase in wiring length can be reduced, and the reliability can be enhanced.

In addition, the two-row pad arrays are arranged in the first direction along one side of the chip, and the power supply line 22, which is disposed between the pad arrays, is shared by the input buffers 32-1 to 32-3 and the output buffers 31-1 and 31-2. Therefore, compared to the case in which pad arrays are provided along two sides of the chip, the area in the second direction can be reduced, and the pattern occupation area of the external connection region can be decreased.

Further, the source regions of the transistors N1 and N2 and the source regions of the transistors N4 and N5 are shared, respectively, by the paired two transistors, and are commonly connected to the power supply line 22. Thus, the area in the second direction can be reduced, and microfabrication can be achieved.

The PMOS transistors P2 and P5 and the NMOS transistors N2 and N5, which constitute the output buffers 31-1 and 31-2, are arranged to be opposed in the second direction so as to sandwich the pads 26-1 and 26-2. Thus, a distance can be secured between the transistor P2, P5 and the transistor N2, N5. Therefore, switching of parasitic thyristors, which are formed of parasitic PNP and NPN bipolar transistors, can be prevented, and so-called latch-up can be prevented. Hence, the reliability can be enhanced. The PMOS transistors P1, P3 and P4 and the NMOS transistors N1, N3 and N4, which constitute the input buffers 32-1 to 32-3, are arranged to be opposed in the second direction on the non-occupied regions of the pads 25-1, 26-1 and 26-2. Thus, in the non-occupied regions, a distance can be secured between the transistor P1, P3, P4 and the transistor N1, N3 and N4. Therefore, latch-up can similarly be prevented, and the reliability can be enhanced. Moreover, since the non-occupied regions can be utilized, the area in the first direction can be reduced.

In the case where the power supply voltages VCC and VCCQ are equal (e.g. 3.3 V), the voltage VCCQ is, for example, a power supply voltage for I/O pads. In this case, the voltage VCCQ tends to be easily mixed with external noise and is unstable. Thus, the voltage VCCQ may be used separately from the power supply voltage VCC. Besides, in the case where the voltages VCC and VCCQ are different (e.g. voltage VCC=about 3.3 V; the voltage VCCQ=about 1.8 V), the voltages may be used in order to distinguish their values.

[Modification 1]

Figure 3:
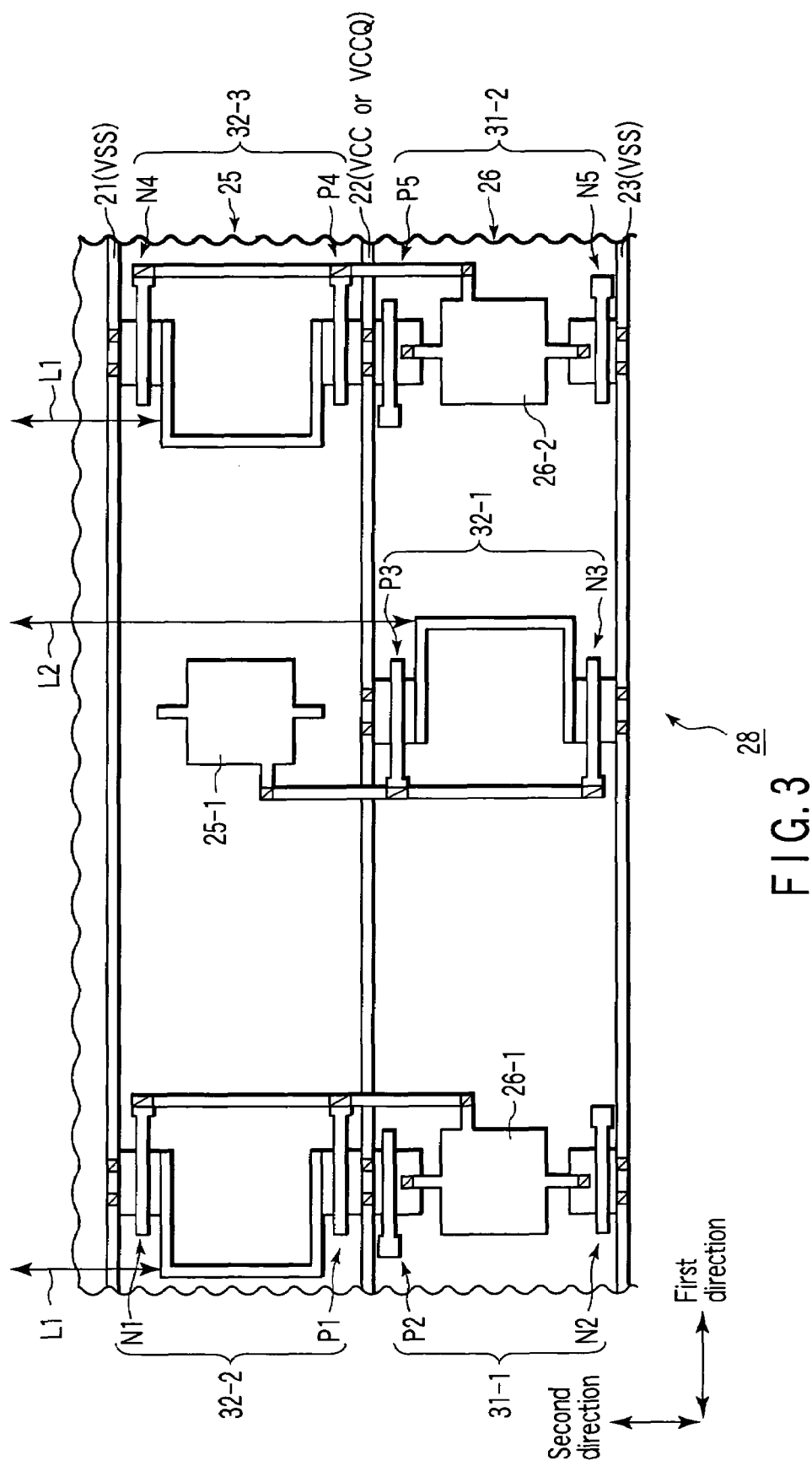
FIG. 3 is a view for describing a semiconductor device according to Modification 1 of the invention, FIG. 3 being a plan view that shows, in enlarged scale, another example of layout of the part boxed by the broken line in FIG. 1.

Next, a semiconductor device according to Modification 1 of the invention is described with reference to FIG. 3. In the description below, a description of parts common to those of the first embodiment is omitted. FIG. 3 is a view for describing the semiconductor device according to Modification 1. FIG. 3 is a plan view that schematically shows the part boxed by the broken line 28 in FIG. 1. In this Modification, compared to the semiconductor device according to the first embodiment, the polarities of the transistors N1 to N5 and P1 to P5, which constitute the input and output buffers, are reversed.

As shown in FIG. 3, a power supply voltage VSS is applied to the power supply lines 21 and 23, and a power supply voltage VCC or VCCQ is applied to the power supply line 22. Further, compared to the semiconductor device according to the first embodiment, the transistors N1 to N5 and P1 to P5 are reversely positioned in the second direction.

The sources of the PMOS transistors P1 to P5 are commonly connected to the power supply line 22 (VCC or VCCQ).

According to the above-described structure, the same advantages as with the first embodiment can be obtained.

Further, where necessary, the polarities of the transistors N1 to N5 and P1 to P5, which constitute the input and output buffers, and the polarities of the power supply voltages, which are applied to the power supply lines 21, 22 and 23, may be reversed.

[Modification 2]

Figure 4:
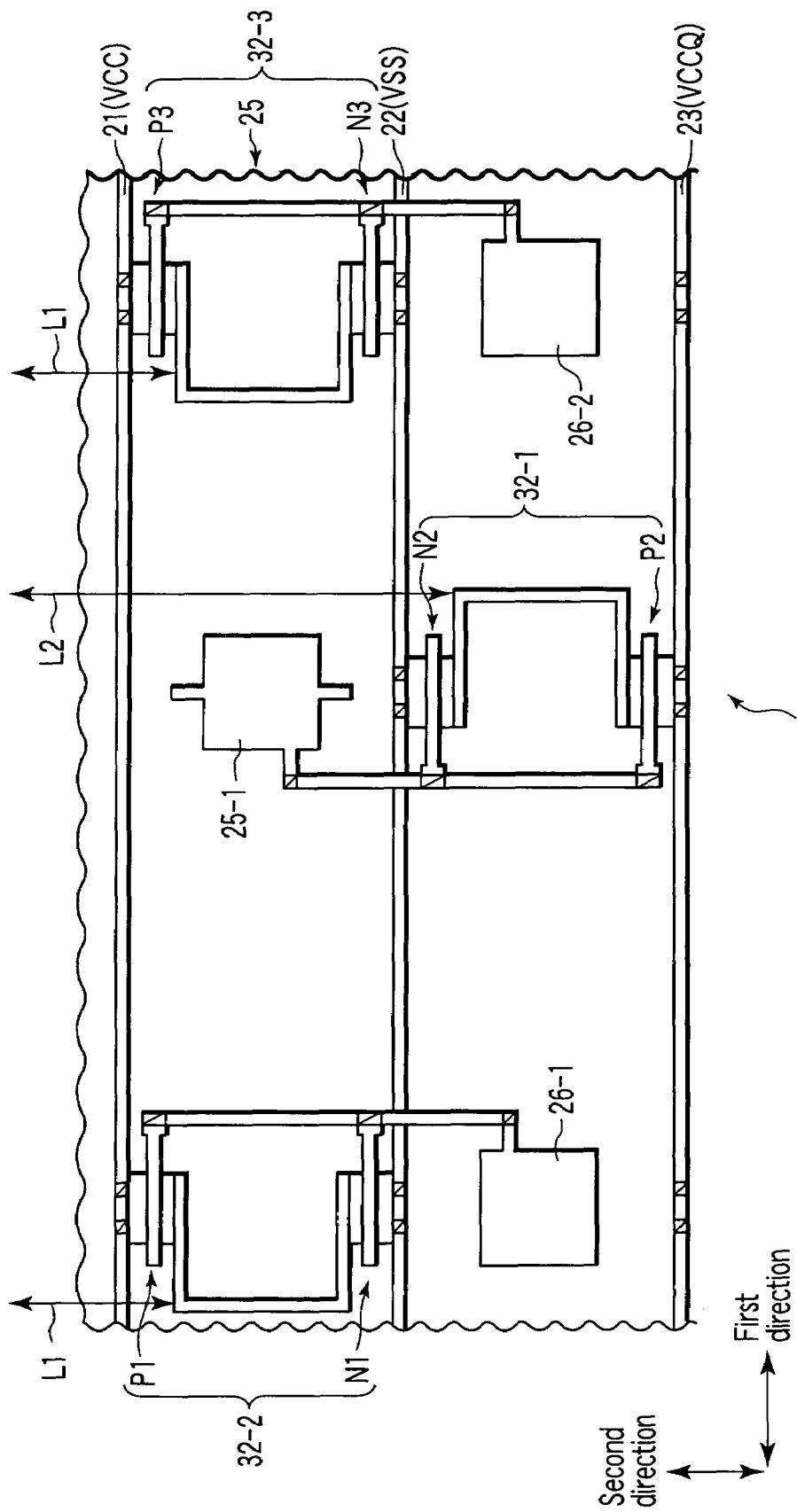
FIG. 4 is a view for describing a semiconductor device according to Modification 2 of the invention, FIG. 4 being a plan view that shows, in enlarged scale, still another example of layout of the part boxed by the broken line in FIG. 1.

Next, a semiconductor device according to Modification 1 of the invention is described with reference to FIG. 4. In the description below, a description of parts common to those of the first embodiment is omitted. FIG. 4 is a view for describing the semiconductor device according to Modification 2. FIG. 4 is a plan view that schematically shows the part boxed by the broken line 28 in FIG. 1.

As shown in FIG. 4, a power supply voltage VCC is applied to the power supply line 21, a power supply voltage VSS is applied to the power supply line 22, and a power supply voltage VCCQ is applied to the power supply line 23.

The output buffer 31-1 is disposed on a non-occupied region between the pads 26-1 and 26-2. The output buffer 31-2 is disposed on a non-occupied region on the left side of the pad 25-1. The output buffer 31-3 is disposed on a non-occupied region on the right side of the pad 25-1.

In the semiconductor device according to this Modification, no input buffer is provided.

According to the above-described structure, the same advantages as with the first embodiment can be obtained. Further, the power supply voltage VCC is applied to the power supply line 21, the power supply voltage VSS is applied to the power supply line 22, and the power supply voltage VCCQ is applied to the power supply line 23.

Thus, the power supply voltages can distinctively be applied to the power supply lines 21, 22 and 23, and it is possible to minimize the effect that is caused on the peripheral part by the power supply voltage VCCQ with a relatively large voltage variation. Therefore, the reliability can be enhanced.

Second Embodiment

Figure 5:
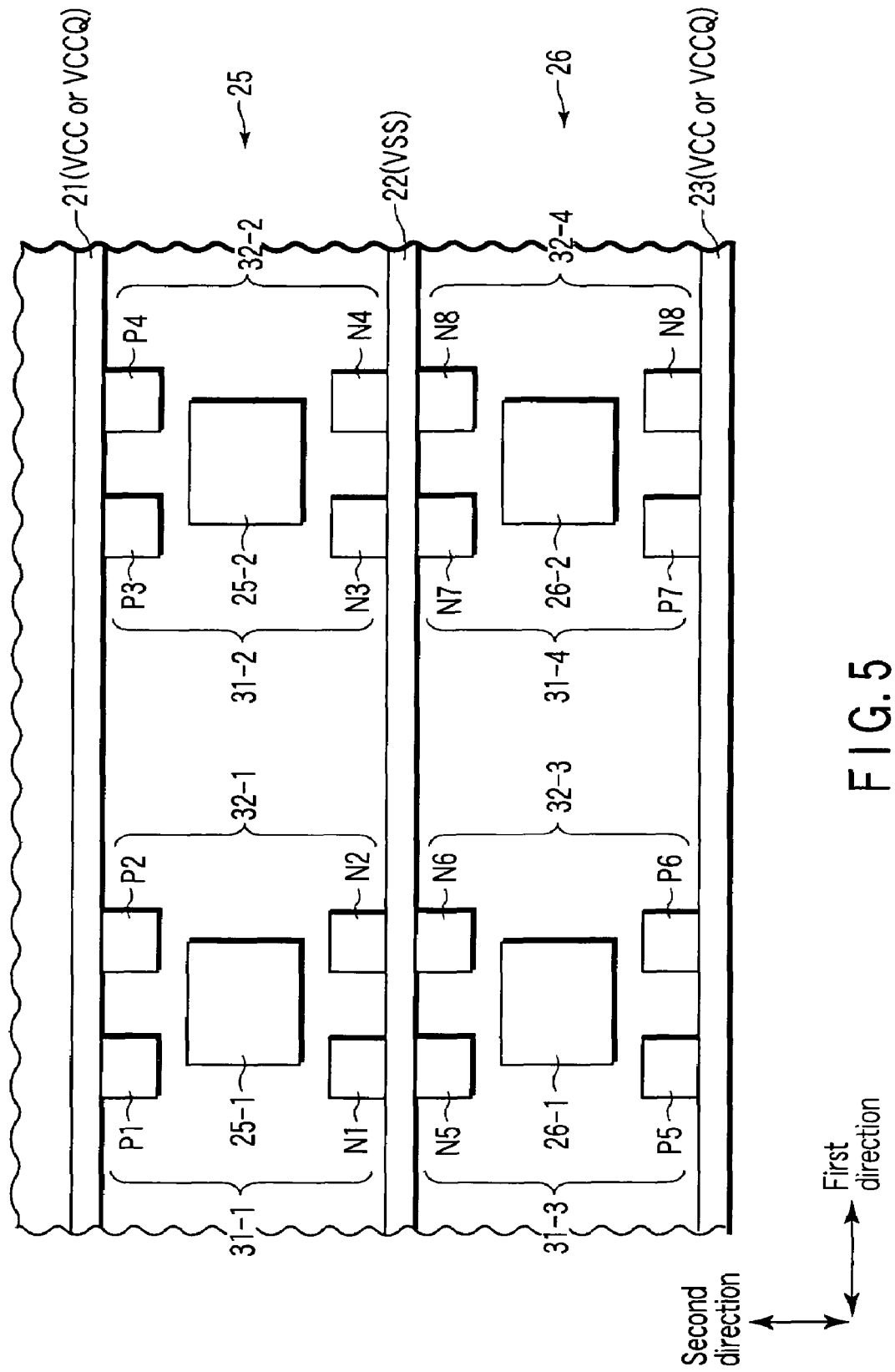
FIG. 5 is a view for describing a semiconductor device according to a second embodiment of the invention, FIG. 5 being a plan view that shows, in enlarged scale, the part boxed by the broken line in FIG. 1.

Next, a semiconductor device according to a second embodiment of the invention is described with reference to FIG. 5. In the description below, a description of parts common to those of the first embodiment is omitted. FIG. 5 is a view for describing the semiconductor device according to the second embodiment. FIG. 5 is a plan view that schematically shows a part of the external connection region 14. In the description of the semiconductor device according to this embodiment, depiction of detailed connections of the transistors, which constitute the output buffers 31 and input buffers 32, is omitted.

As shown in the Figure, output pads 31-1 to 31-4 and input pads 32-1 to 32-4 are provided in the second direction so as to sandwich pads 25-1, 25-2, 26-1 and 26-2.

The output buffers 31-1 to 31-4 include PMOS transistors P1, P3, P5 and P7 and NMOS transistors N1, N3, N5 and N7, which are disposed to be opposed in the second direction so as to sandwich the pads 25-1, 25-2, 26-1 and 26-2.

The input buffers 32-1 to 32-4 include PMOS transistors P2, P4, P6 and P8 and NMOS transistors N2, N4, N6 and N8, which are disposed to be opposed in the second direction so as to sandwich the pads 25-1, 25-2, 26-1 and 26-2.

None of the pads of the pad arrays 25 and 26 is disposed with a displaced pitch in the first direction.

The sources of the NMOS transistors N1 to N6 are commonly connected to the power supply line 22. In the other respects, the structure of the second embodiment is the same as that of the first embodiment.

According to the above-described structure, the same advantages as with the first embodiment can be obtained. Further, the arrangement of the pads and output/input buffers may be altered, where necessary, as shown in the Figure.

Besides, the sources of the NMOS transistors N1 to N6 are commonly connected to the power supply line 22. Therefore, the area in the second direction can be reduced.

[Modification 3]

Figure 6:
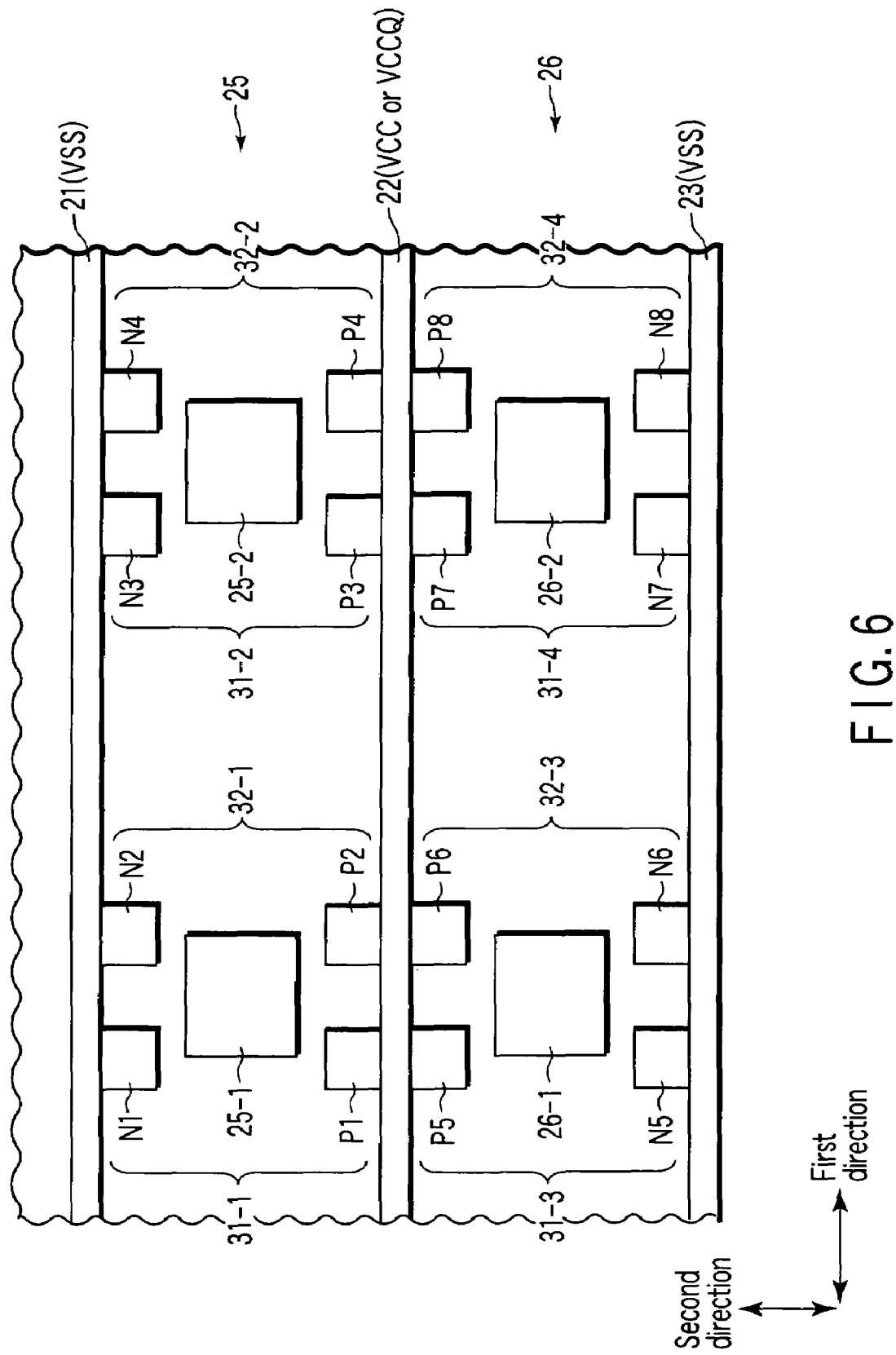
FIG. 6 is a view for describing a semiconductor device according to Modification 3 of the invention, FIG. 6 being a plan view that shows, in enlarged scale, still another example of layout of the part boxed by the broken line in FIG. 1.

Next, a semiconductor device according to Modification 3 of the invention is described with reference to FIG. 6. In the description below, a description of parts common to those of the second embodiment is omitted. FIG. 5 is a view for describing the semiconductor device according to Modification 2. FIG. 6 is a plan view that schematically shows a part of the external connection region 14. In this Modification, compared to the semiconductor device according to the second embodiment, the polarities of the transistors N1 to N8 and P1 to P8, which constitute the input and output buffers, are reversed.

As shown in FIG. 6, a power supply voltage VSS is applied to the power supply lines 21 and 23, and a power supply voltage VCC or VCCQ is applied to the power supply line 22. The sources of the PMOS transistors P1 to P8 are commonly connected to the power supply line 22. In the other respects, the structure of Modification 3 is the same as that of the second embodiment.

According to the above-described structure, the same advantages as with the second embodiment can be obtained. Further, where necessary, the polarities of the power supply voltages, which are applied to the power supply lines 21, 22 and 23, and the polarities of the transistors N1 to N8 and P1 to P8 may be altered.

Third Embodiment

Figure 7:
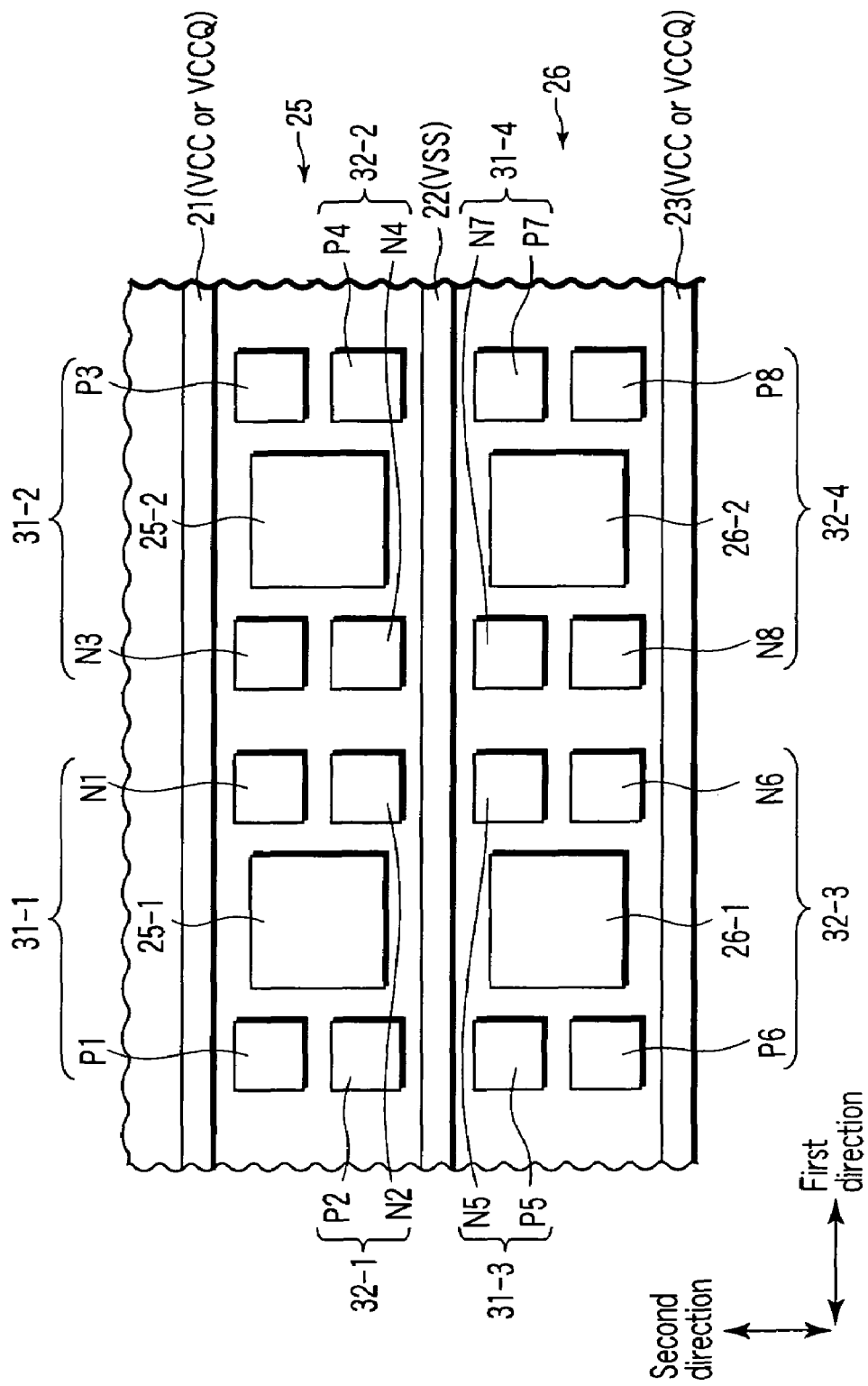
FIG. 7 is a view for describing a semiconductor device according to a third embodiment of the invention, FIG. 7 being a plan view that shows, in enlarged scale, the part boxed by the broken line in FIG. 1.

Next, a semiconductor device according to a third embodiment of the invention is described with reference to FIG. 7. In the description below, a description of parts common to those of the first embodiment is omitted. FIG. 7 is a view for describing the semiconductor device according to the third embodiment. FIG. 7 is a plan view that schematically shows a part of the external connection region 14.

As shown in the Figure, output buffers 31-1 to 31-4 and input buffers 32-1 to 32-4 are provided in the first direction so as to sandwich pads 25-1, 25-2, 26-1 and 26-2 of the pad arrays 25 and 26.

The output buffers 31-1 to 31-4 include PMOS transistors P1, P3, P5 and P7 and NMOS transistors N1, N3, N5 and N7, which are disposed to be opposed in the first direction so as to sandwich the pads 25-1, 25-2, 26-1 and 26-2.

The input buffers 32-1 to 32-4 include PMOS transistors P2, P4, P6 and P8 and NMOS transistors N2, N4, N6 and N8, which are disposed to be opposed in the first direction so as to sandwich the pads 25-1, 25-2, 26-1 and 26-2. In the other respects, the structure of the third embodiment is the same as that of the first embodiment.

According to the above-described structure, the same advantages as with the first embodiment can be obtained. Further, the PMOS transistors P1 to P8 and the NMOS transistors N1 to N8 are disposed to be opposed in the first direction so as to sandwich the pads 25-1 and 26-1.

Thus, the arrangement of the transistors P1 to P8 and N1 to N8 can be altered, where necessary.

[Modification 4]

Figure 8:
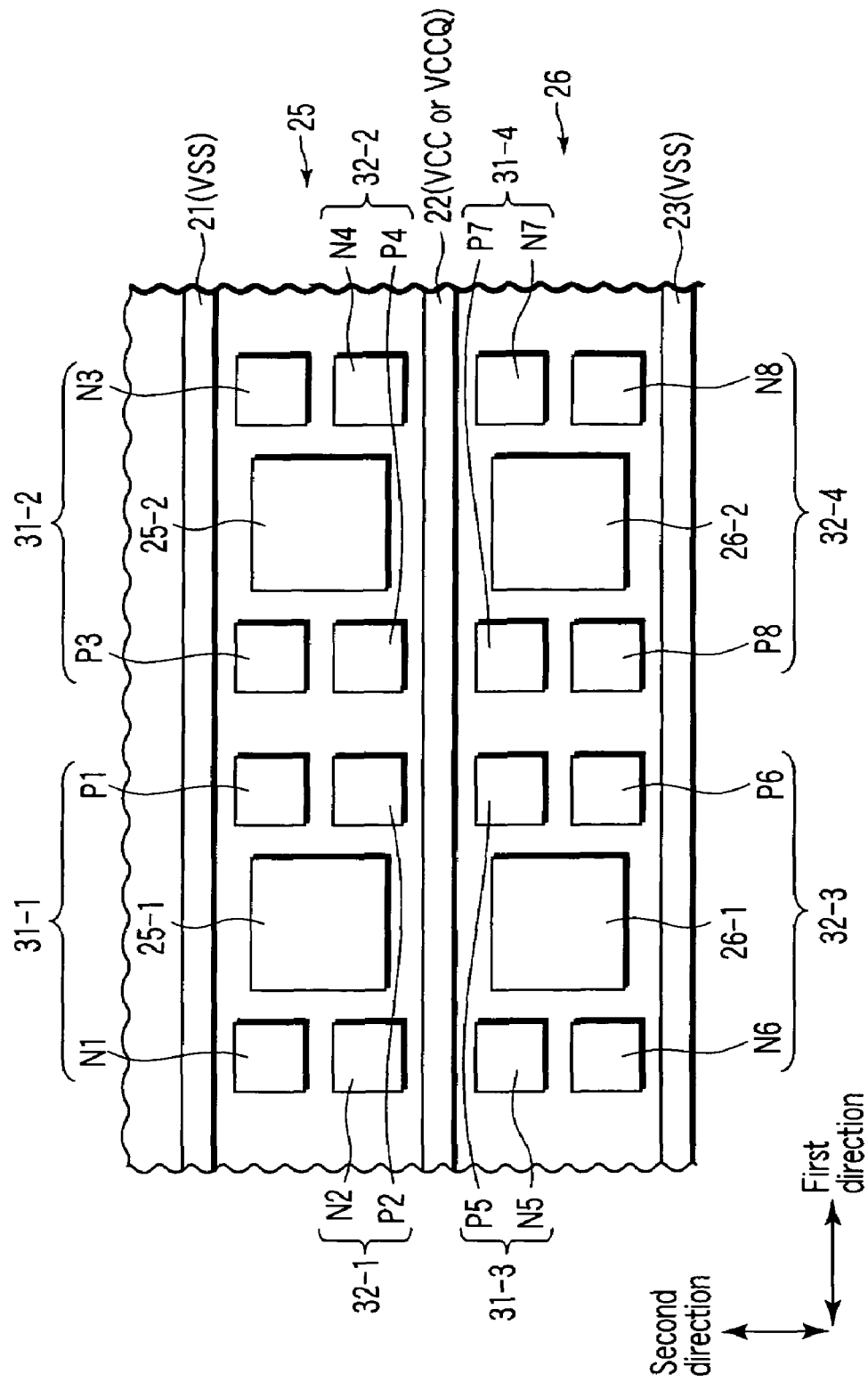
FIG. 8 is a view for describing a semiconductor device according to Modification 4 of the invention, FIG. 8 being a plan view that shows, in enlarged scale, still another example of layout of the part boxed by the broken line in FIG. 1.

Next, a semiconductor device according to Modification 4 of the invention is described with reference to FIG. 8. In the description below, a description of parts common to those of the third embodiment is omitted. FIG. 8 is a view for describing the semiconductor device according to Modification 4. FIG. 8 is a plan view that schematically shows a part of the external connection region 14. In this Modification, compared to the semiconductor device according to the third embodiment, the polarities of the transistors N1 to N8 and P1 to P8, which constitute the input and output buffers, are reversed.

As shown in FIG. 8, a power supply voltage VSS is applied to the power supply lines 21 and 23, and a power supply voltage VCC or VCCQ is applied to the power supply line 22. In the other respects, the structure of Modification 4 is the same as that of the third embodiment.

According to the above-described structure, the same advantages as with the third embodiment can be obtained. Further, the power supply voltage VSS is applied to the power supply lines 21 and 23, and the power supply voltage VCC or VCCQ is applied to the power supply line 22.

Thus, where necessary, the polarities of the power supply voltages, which are applied to the power supply lines 21, 22 and 23, and the polarities of the transistors may be altered.

Fourth Embodiment

Figure 9:
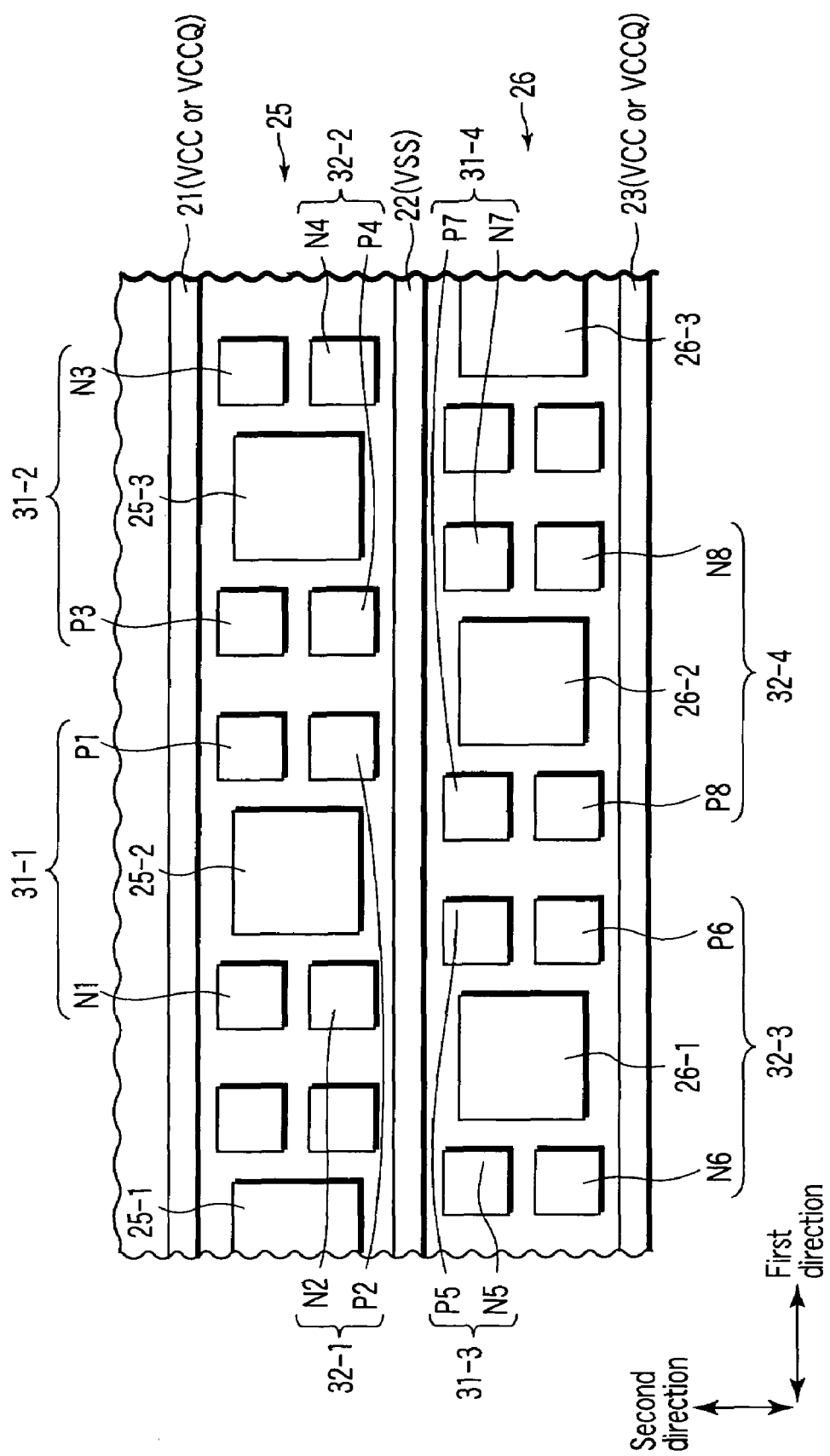
FIG. 9 is a view for describing a semiconductor device according to a fourth embodiment of the invention, FIG. 9 being a plan view that shows, in enlarged scale, the part boxed by the broken line in FIG. 1.
Figure 10:
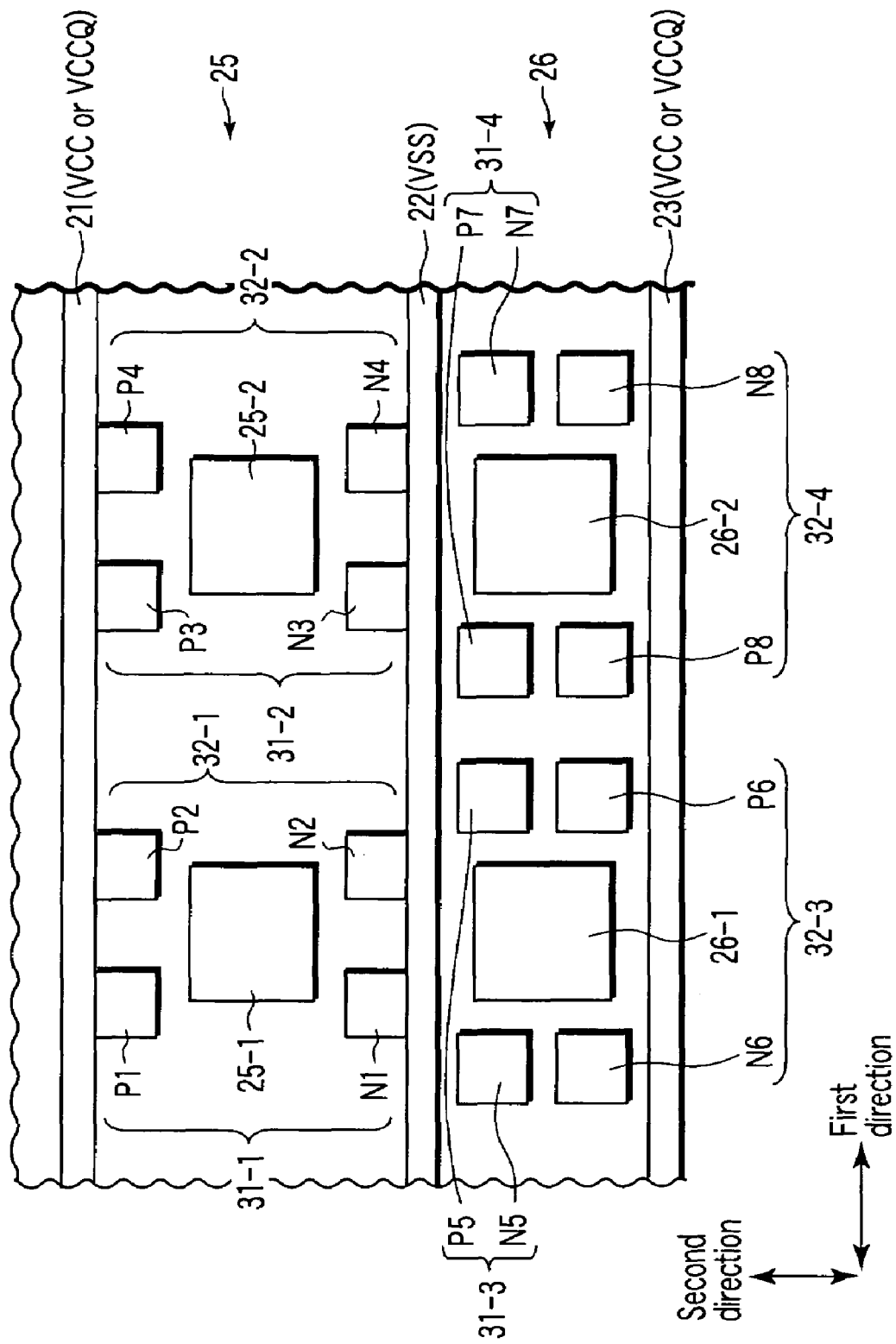
FIG. 10 is a view for describing a semiconductor device according to a fifth embodiment of the invention, FIG. 10 being a plan view that shows, in enlarged scale, the part boxed by the broken line in FIG. 1.

Next, a semiconductor device according to a fourth embodiment of the invention is described with reference to FIG. 9. In the description below, a description of parts common to those of the third embodiment is omitted. FIG. 9 is a view for describing the semiconductor device according to the fourth embodiment. FIG. 9 is a plan view that schematically shows a part of the external connection region 14.

As shown in the Figure, the pad array 26 is provided with a displacement of about ½ pitch in the first direction, relative to the pads 25-1 to 25-3 of the pad array 25. Thus, the pad arrays 25 and 26 are arranged in a so-called staggered fashion. The sources of the NMOS transistors N1 to N8 are commonly connected to the power supply line 22. In the other respects, the structure of the fourth embodiment is the same as that of the third embodiment.

According to the above-described structure, the same advantages as with the first embodiment can be obtained.

Needless to say, as in the above-described Modifications, the polarities of the transistors N1 to N8 and P1 to P8, which constitute the input and output buffers of the semiconductor device of this embodiment, and the polarities of the power supply voltages, which are applied to the power supply lines 21, 22 and 23, may be reversed.

Fifth Embodiment

Next, a semiconductor device according to a fourth embodiment of the invention is described with reference to FIG. 9. In the description below, a description of parts common to those of the fourth embodiment is omitted. FIG. 9 is a view for describing the semiconductor device according to Modification 4, and is a plan view that schematically shows a part of the external connection region 14. In this modification, output buffers 31 and input buffers 32 are disposed in the second direction in the pad array 25, and are disposed in the first direction in the pad array 26;

As shown in the Figure, PMOS transistors P1 and P3 and NMOS transistors N1 and N3, which constitute the output buffers 31-1 and 31-2 in the pad array 25, are disposed to be opposed in the second direction so as to sandwich the pads 25-1 and 25-2. PMOS transistors P2 and P4 and NMOS transistors N2 and N4, which constitute the input buffers 32-1 and 32-2 in the pad array 25, are disposed to be opposed in the second direction so as to sandwich the pads 25-1 and 25-2.

PMOS transistors P5 and P7 and NMOS transistors N5 and N7, which constitute the output buffers 31-3 and 31-4 in the pad array 26, are disposed to be opposed in the first direction so as to sandwich the pads 26-1 and 26-2. PMOS transistors P6 and P8 and NMOS transistors N6 and N8, which constitute the input buffers 32-3 and 32-4 in the pad array 26, are disposed to be opposed in the first direction so as to sandwich the pads 26-1 and 26-2. In the other respects, the structure of the fifth embodiment is the same as that of the fourth embodiment.

According to the above-described structure, the same advantages as with the fourth embodiment can be obtained. Further, the output buffers 31 and input buffers 32 are disposed in the second direction in the pad array 25, and are disposed in the first direction in the pad array 26.

Thus, the arrangement of the transistors P1 to P8 and N1 to N8, which constitute the output buffers 31 and input buffers 32, can be altered, where necessary.

Sixth Embodiment

Figure 11:
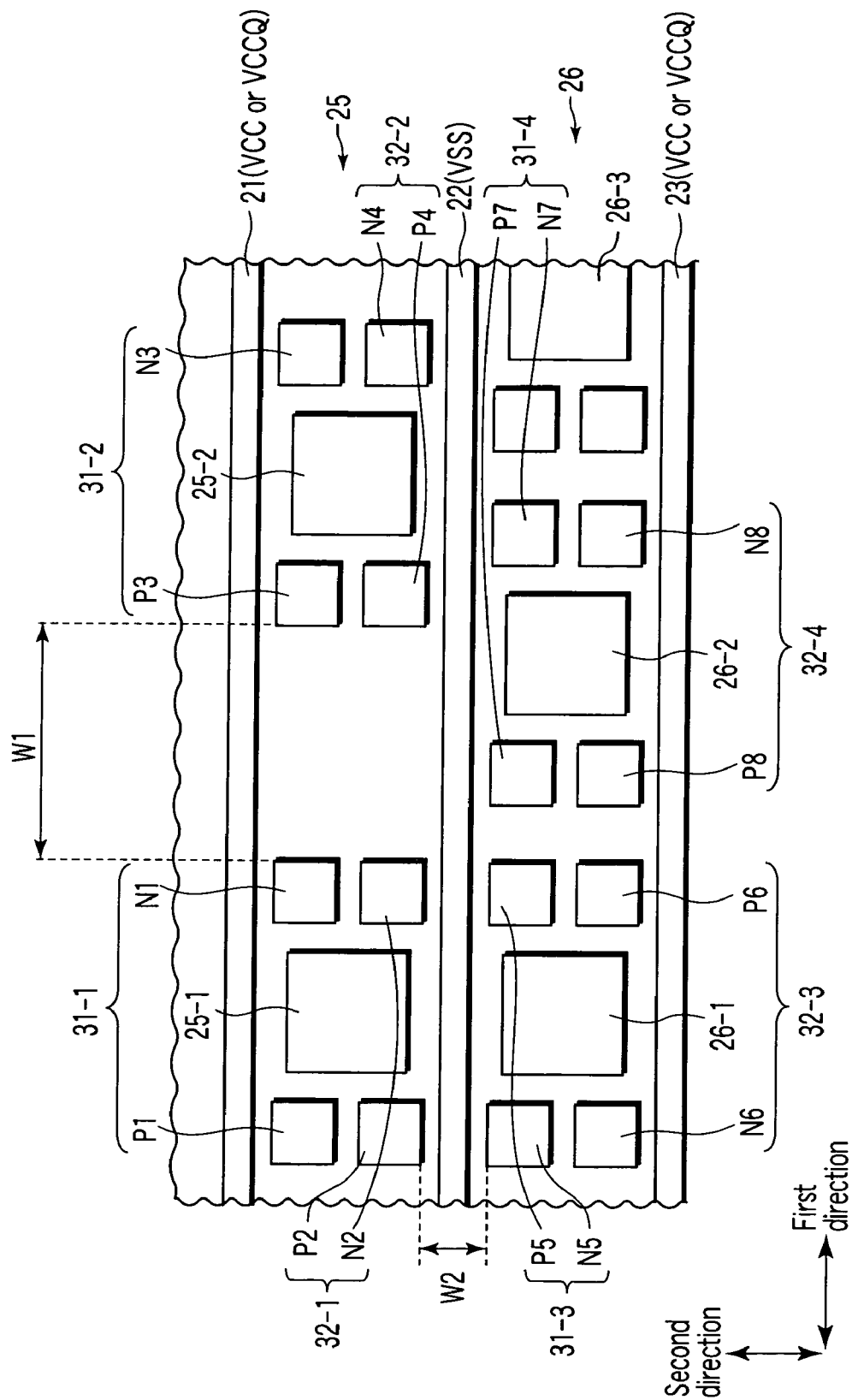
FIG. 11 is a view for describing a semiconductor device according to a sixth embodiment of the invention, FIG. 11 being a plan view that shows, in enlarged scale, the part boxed by the broken line in FIG. 1.

Next, a semiconductor device according to a sixth embodiment of the invention is described with reference to FIG. 11. In the description below, a description of parts common to those of the fifth embodiment is omitted. FIG. 11 is a view for describing the semiconductor device according to the fifth embodiment. FIG. 11 is a plan view that schematically shows a part of the external connection region 14.

As shown in FIG. 11, a transistor N1 and a transistor P3, which have different polarities, are disposed adjacent to each other in the first direction. A distance (space) W1 in the first direction is provided between the sources of the neighboring transistors N1 and N2 and the sources of neighboring transistors P1 and P2. The distance W1 is, e.g. about 100 µm.

Transistor P2 and N5, which have different polarities, and transistors N2 and P5, which have different polarities, are disposed adjacent to each other in the second direction. Further, a distance W2 in the second direction is provided between the sources of the neighboring transistors P2, P5 and the sources of the neighboring transistors N2, N5.

According to the above-described structure, the same advantages as with the fourth embodiment can be obtained. Further, the distance W1 in the first direction is provided between the sources of the neighboring transistors N1 and N2 and the sources of neighboring transistors P1 and P2.

Thus, the distance W1 is provided between the sources of the transistors with different polarities, thereby to prevent switching of parasitic thyristors, which are formed of parasitic PNP and NPN bipolar transistors. Therefore, so-called latch-up can be prevented, and the reliability can be enhanced.

The distance W2 in the second direction is provided between the sources of the neighboring transistors P2, P5 and the sources of the neighboring transistors N2, N5.

Thus, by virtue of the same function as described above, latch-up can be prevented and the reliability can be enhanced.

Since the transistors with different polarities can be arranged adjacent to each other in the first and second directions, PMOS transistors or NMOS transistors may be arranged, where necessary, while latch-up can be prevented.

The present invention has been described by referring to the first to sixth embodiments and Modifications 1 to 4. The present invention is not limited to the above-described embodiments and Modifications. Various modifications can be made in practice without departing from the spirit of the invention. The embodiments and Modifications include various inventions, and various inventions can be derived from proper combinations of structural elements disclosed herein. For example, in the case where at least one of the problems described in the specification can be solved and at least one of the advantageous effects described in the specification can be achieved, even if some structural elements are omitted from all the structural elements disclosed in the embodiments and Modifications, the structure without such structural elements can be derived as an invention.

What is claimed is:

1. A semiconductor device comprising:
  a first power supply line which extends in a first direction at one side of a semiconductor chip, and to which a first power supply voltage is to be applied;
  a second power supply line which is disposed at one side of the first power supply line, which extends in the first direction, and to which a second power supply voltage higher than the first power supply voltage or a third power supply voltage higher than the first power supply voltage and lower than the second power supply voltage is to be applied;
  a third power supply line which is disposed at the other side of the first power supply line, which extends in the first direction, and to which the second or the third power supply voltage is to be applied;
  a first pad array to which an input signal from an external point is supplied, the first pad array being disposed between the first and the second power supply lines, and including a plurality of first pads which are disposed in the first direction;
  a second pad array to which an output signal to the external point is supplied, the second pad array being disposed between the first and the third power supply lines, the second pad array including a plurality of second pads which are disposed in the first direction;
  a plurality of first buffer circuits which are operated by a voltage between the first and second power supply lines, each of the first buffer circuit being disposed between the first pads, and including a first NMOS transistor and a first PMOS transistor which are connected to one of the second pads; and
  a plurality of second buffer circuits which are operated by a voltage between the first and third power supply lines, each of the second buffer circuit being disposed between the second pads, and including a second NMOS transistor and a second PMOS transistor which are connected to one of the first pads.

2. The semiconductor device according to claim 1, wherein each of the first buffer circuits is disposed to correspond to an associated one of the second pads in a second direction which is perpendicular to the first direction, and each of the second buffer circuits is disposed to correspond to an associated one of the first pads in the second direction.

3. A semiconductor device comprising:

a first power supply line which extends in a first direction at one side of a semiconductor chip, and to which a first power supply voltage is to be applied;

a second power supply line which is disposed at one side of the first power supply line, which extends in the first direction, and to which a second power supply voltage higher than the first power supply voltage is to be applied;

a third power supply line which is disposed at the other side of the first power supply line, which extends in the first direction, and to which a third power supply voltage higher than the first power supply voltage and lower than the second power supply voltage is to be applied;

a first pad array to which an input signal from an external point is supplied, the first pad array being disposed between the first and the second power supply lines, and including a plurality of first pads which are disposed in the first direction;

a second pad array to which an output signal is supplied, the second pad array being disposed between the first and the third power supply lines, the second pad array including a plurality of second pads which are disposed in the first direction;

a plurality of first buffer circuits which are operated by a voltage between the first and second power supply lines, each of the first buffer circuit being disposed between the first pads, and including a first NMOS transistor and a first PMOS transistor which are connected to one of the second pads; and a plurality of second buffer circuits which are operated by a voltage between the first and third power supply lines, each of the second buffer circuit being disposed between the second pads, and including a second NMOS transistor and a second PMOS transistor which are connected to one of the first pads.

4. The semiconductor device according to claim 3, wherein each of the first buffer circuits is disposed to correspond to one of the second pads in a second direction which is perpendicular to the first direction, and each of the second buffer circuits is disposed to correspond to one of the first pads in the second direction.

* * * * *